(12) United States Patent
Dai et al.

(10) Patent No.: US 8,974,904 B2
(45) Date of Patent: Mar. 10, 2015

(54) ALIGNED CARBON NANOTUBES FOR DRY ADHESIVES AND METHODS FOR PRODUCING SAME

(75) Inventors: Liming Dai, Beavercreek, OH (US); Liangti Qu, Kettering, OH (US); Morley O. Stone, Bellbrook, OH (US)

(73) Assignee: University of Dayton, Dayton, OH (US)

( * ) Notice: Subject to any disclaimer, the term of this patent is extended or adjusted under 35 U.S.C. 154(b) by 2377 days.

(21) Appl. No.: 11/773,499

(22) Filed: Jul. 5, 2007

(65) Prior Publication Data
US 2009/0011232 A1    Jan. 8, 2009

(51) Int. Cl.
| | | |
|---|---|---|
| *B32B 9/00* | (2006.01) | |
| *C23C 16/26* | (2006.01) | |
| *B82Y 30/00* | (2011.01) | |
| *B82Y 40/00* | (2011.01) | |
| *C01B 31/02* | (2006.01) | |
| *C09J 7/00* | (2006.01) | |

(52) U.S. Cl.
CPC ............. *C23C 16/26* (2013.01); *B82Y 30/00* (2013.01); *B82Y 40/00* (2013.01); *C01B 31/0233* (2013.01); *C01B 31/0273* (2013.01); *C09J 7/00* (2013.01); *C01B 2202/02* (2013.01); *C01B 2202/06* (2013.01); *C01B 2202/08* (2013.01); *C01B 2202/36* (2013.01); *C09J 2201/626* (2013.01); *Y10S 977/742* (2013.01)
USPC ............................ 428/408; 423/448; 977/742

(58) Field of Classification Search
USPC ................ 428/408; 423/447.1, 447.2, 447.3; 977/742
See application file for complete search history.

(56) References Cited

U.S. PATENT DOCUMENTS 6,331,209 B1 *  12/2001  Jang et al. .................... 117/90
2006/0068195 A1 *  3/2006  Majumdar et al. ............ 428/323

OTHER PUBLICATIONS

Huang, Shaoming et al, "Patterned Growth and Contact Transfer of Well-Aligned Carbon Nanotube Films", J. Phys. Chem. B 1999, 103, pp. 4223-4227.
Yang, Junbing et al., "Multicomponent Interposed Carbon Nanotube Micropatterns by Region-Specific Contact Transfer and Self-Assembling", J. Phys. Chem. B 2003, 107, pp. 12387-12390.

* cited by examiner

*Primary Examiner* — Daniel H Miller
(74) *Attorney, Agent, or Firm* — Dinsmore & Shohl LLP

(57) ABSTRACT

A nanocomposite dry adhesive. The nanocomposite dry adhesive includes a substrate; and an array of vertically aligned single-walled carbon nanotubes or vertically aligned multi-walled carbon nanotubes on the substrate, wherein the nanocomposite dry adhesive utilizes the array of single-walled carbon nanotubes or multi-walled carbon nanotubes as synthesized, the as synthesized single-walled carbon nanotubes being substantially free of randomly entangled nanotube segments on top of the vertically aligned single-walled carbon nanotubes, the as synthesized multi-walled carbon nanotubes having randomly entangled nanotube segments on top of the vertically aligned multi-walled carbon nanotubes; wherein the dry adhesive has a normal adhesion strength of at least about 5 $N \cdot cm^{-2}$, and a shear adhesion strength of at least about 13 $N \cdot cm^{-2}$. Methods of making a nanocomposite dry adhesive are also described.

26 Claims, 13 Drawing Sheets

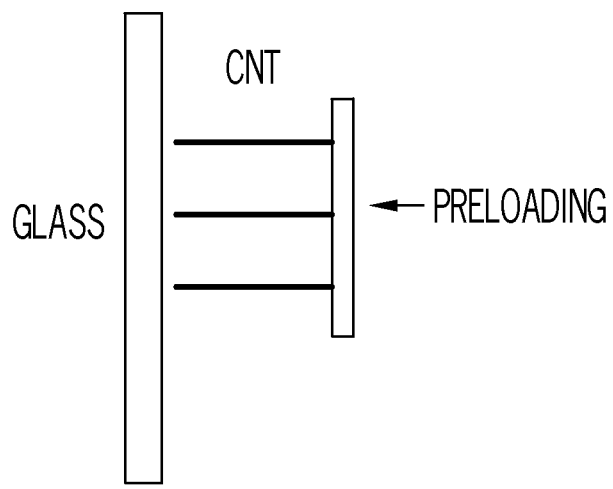
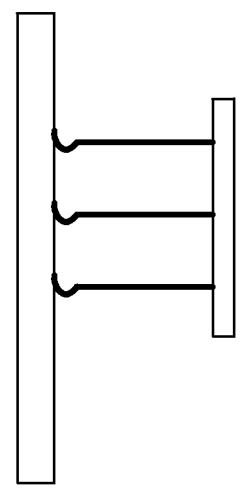
FIG. 6A                FIG. 6B
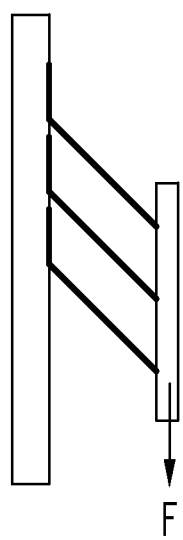
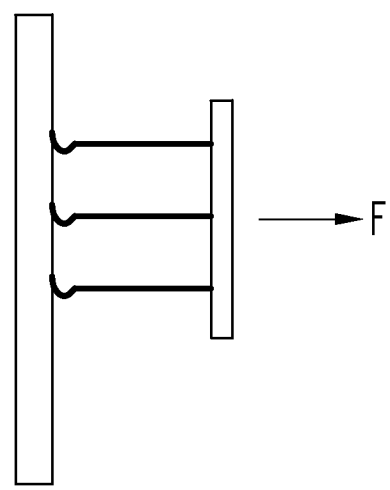
FIG. 6C                FIG. 6D

ALIGNED CARBON NANOTUBES FOR DRY ADHESIVES AND METHODS FOR PRODUCING SAME

BACKGROUND OF THE INVENTION

The unusual ability of gecko lizards to climb on any vertical surface and hang from the ceiling with one toe has inspired scientific research for centuries. Recent studies revealed that the driving force for holding gecko lizards on a surface arises from the strong van der Waals forces (about 10 $N\cdot cm^{-2}$) induced by hundreds of thousands of aligned microscopic elastic hairs called setae (3-130 µm in length) containing hundreds of spatulae (0.2-0.5 µm in diameter) on a gecko's foot. The gecko has an unusually strong adhesion force upon pulling the setae parallel to the surface during attachment and a weak adhesion force perpendicular to the surface during detachment.

These findings have prompted researchers to fabricate microarrays of polymer pillars to mimic gecko feet. However, these polymeric dry adhesives (with a maximum achievable adhesive force of about 3 $N\cdot cm^{-2}$) are not comparable to gecko feet due to the inability to mimic the fine structure of geckos' setae and spatulae synthetically.

Work with macroscopic arrays of vertically-aligned multi-walled carbon nanotubes (VA-MWNTs) yielded a direction-independent adhesive force of 11.7 $N\cdot cm^{-2}$ for an as-synthesized VA-MWNT array, which is comparable to the overall adhesive strength observed for a gecko's foot. The VA-MWNT arrays were produced by chemical vapor deposition. (Fe was used as the catalyst, and the carbon source was a hydrocarbon gas (e.g., acetylene)). During the pyrolytic growth of the VA-MWNTs, the initially formed carbon nanotube (CNT) segments from the "base-growth" process grew in random directions and formed a "coiled/entangled" nanotube top layer on the resultant VA-MWNT array. The top layer of entangled nanotube segments prevented the underlying VA-MWNTs from contacting the target surface. It was demonstrated that the adhesion force could be increased by removal of the randomly-distributed CNT segments from the top surface of the VA-MWNT array through plasma etching. The necessity of the additional step makes this a more complicated process.

Efforts have been made recently to synthesize vertically-aligned single-walled carbon nanotube (VA-SWNT) arrays. The VA-SWNTs show potential for dry adhesion applications with additional electrical/thermal management capabilities because of their extremely high aspect ratio, exceptional mechanical strength, and excellent electronic and thermal properties. The smaller nanotube diameter could also allow VA-SWNT arrays to have more contact points per unit surface area compared to their multi-walled counterparts, leading to an enhanced adhesion force for the VA-SWNT dry adhesives.

However, the chemistry for synthesizing high quality VA-SWNT arrays consistently is still not mature. Although studies have reported that VA-SWNT arrays can be produced by pyrolysis of certain hydrocarbons in the presence of $H_2$, $H_2O$, or $O_2$ activated by microwave, RF discharge, or hot filament, our attempts to reproduce VA-SWNTs by most of the reported methods were not successful. This was probably due to a narrow window of growth parameters associated with those reported methods.

Therefore, there is a need for an easy and reliable method for producing VA-MWNT and VA-SWNT arrays having a high shear adhesive force, and for dry adhesives using the VA-MWNT and VA-SWNT arrays.

SUMMARY OF THE INVENTION

The present invention meets this need by providing a nanocomposite dry adhesive. The nanocomposite dry adhesive includes a substrate; and an array of vertically aligned single-walled carbon nanotubes or vertically aligned multi-walled carbon nanotubes on the substrate, wherein the nanocomposite dry adhesive utilizes the array of single-walled carbon nanotubes or multi-walled carbon nanotubes as synthesized, the as synthesized single-walled carbon nanotubes being substantially free of randomly entangled nanotube segments on top of the vertically aligned single-walled carbon nanotubes, the as synthesized multi-walled carbon nanotubes having randomly entangled nanotube segments on top of the vertically aligned multi-walled carbon nanotubes; wherein the dry adhesive has a normal adhesion strength of at least about 5 $N\cdot cm^{-2}$, and a shear adhesion strength of at least about 13 $N\cdot cm^{-2}$.

Another aspect of the invention is a method of making a nanocomposite dry adhesive. One method includes providing a substrate having a catalyst thereon; preheating the substrate in a tube furnace; introducing a source of carbon into the tube furnace; and depositing an array of vertically-aligned multi-walled carbon nanotubes on the substrate using chemical vapor deposition, wherein the nanocomposite dry adhesive utilizes the array of multi-walled carbon nanotubes as synthesized, the as synthesized multi-walled carbon nanotubes having randomly entangled nanotube segments on top of the vertically aligned multi-walled carbon nanotubes; wherein the nanocomposite dry adhesive has a normal adhesion strength of at least about 5 $N\cdot cm^{-2}$, and a shear adhesion strength of at least about 13 $N\cdot cm^{-2}$.

Another method includes providing a substrate having a catalyst thereon; moving the substrate from a cool zone into the center of a plasma-enhanced tube furnace in less than about 5 seconds; introducing a source of carbon into the plasma-enhanced tube furnace; and depositing an array of vertically-aligned single-walled carbon nanotubes on the substrate using plasma enhanced chemical vapor deposition, wherein the nanocomposite dry adhesive utilizes the array of single-walled carbon nanotubes as synthesized, the as synthesized single-walled carbon nanotubes being substantially free of randomly entangled nanotube segments on top of the vertically aligned single-walled carbon nanotubes; wherein the nanocomposite dry adhesive has a normal adhesion strength of at least about 5 $N\cdot cm^{-2}$, and a shear adhesion strength of at least about 13 $N\cdot cm^{-2}$.

DETAILED DESCRIPTION OF THE DRAWINGS

FIGS. 1A and B show SEM images of the VA-MWNT film.

FIGS. 4A-F show SEM images of the top of the VA-MWNT film having different lengths before and after adhesion measurements.

FIGS. 5A-F show SEM images of the cross-section of the VA-MWNT film having different lengths before and after adhesion measurements.

FIGS. 6A-D are schematics showing the morphological change of VA-MWNT arrays during the adhesion measurement.

FIGS. 7A-D show SEM images of the top of the VA-MWNT film as-synthesized and after oxygen etching and before and after the adhesion measurement.

Figure 8:
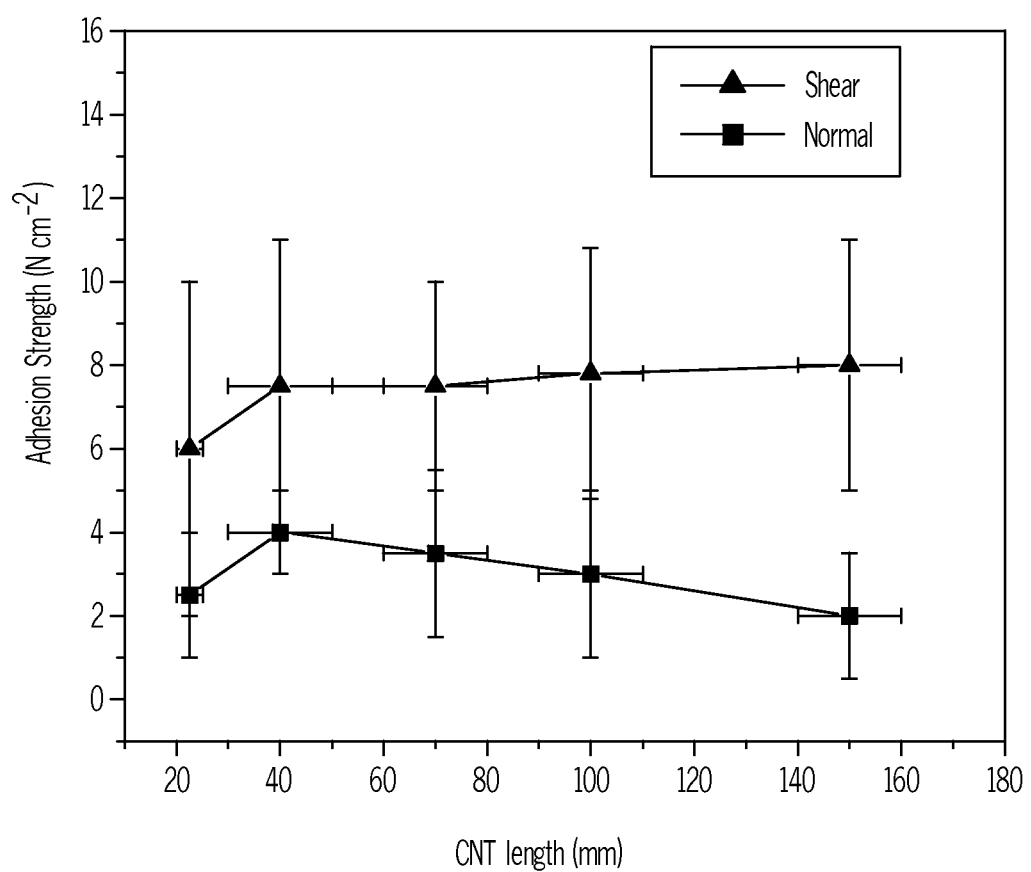

FIG. 8 is a graph showing the adhesive strength of the VA-MWNT array as a function of length after plasma etching.

FIGS. 9A-D show SEM images of the plasma etched VA-MWNT array before and after growing CNTs on it.

Figure 10:
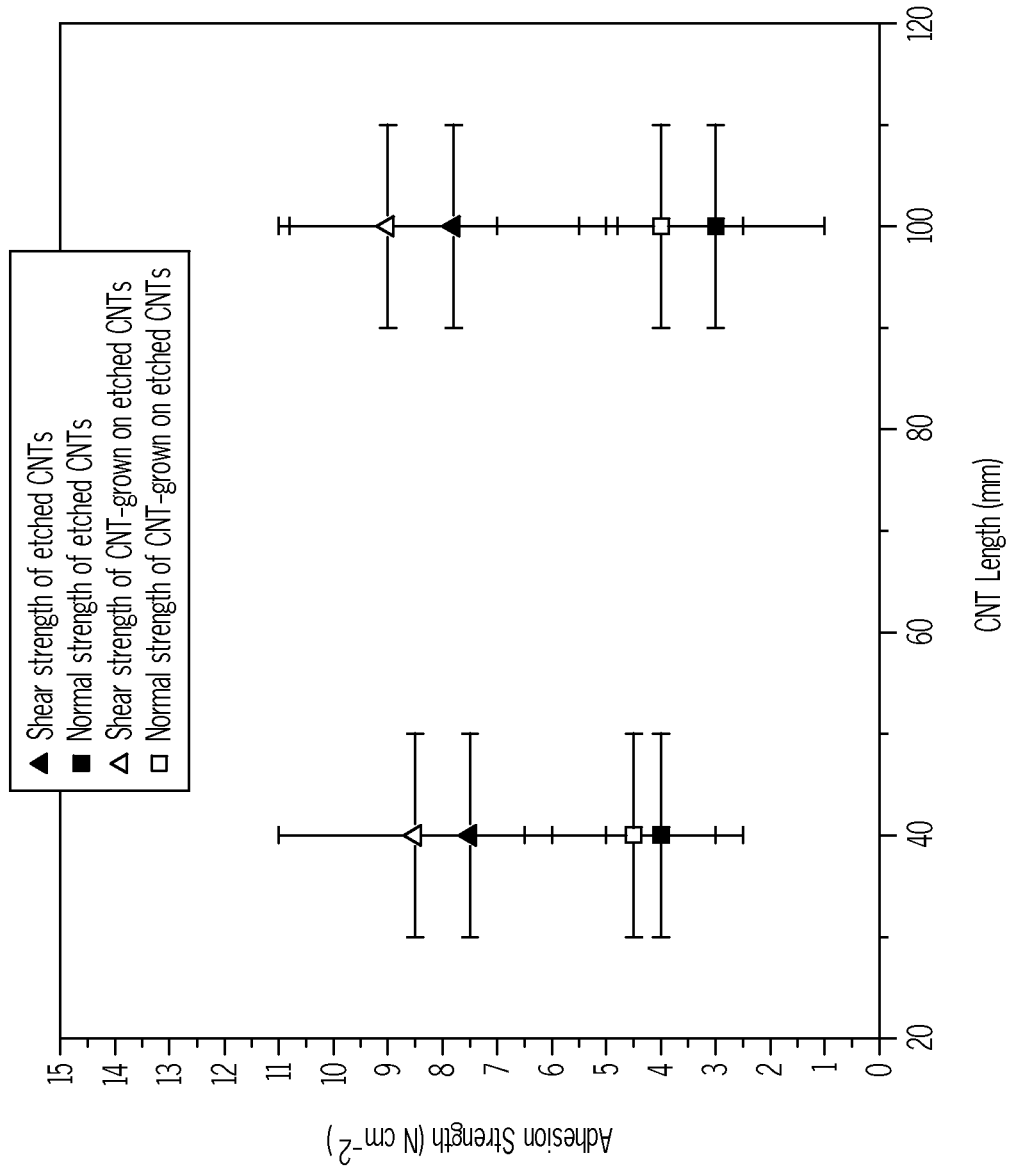

FIG. 10 is a graph comparing the adhesion strength of the plasma-etched VA-MWNT array with and without the non-aligned CNTs grown on it.

Figure 11A:
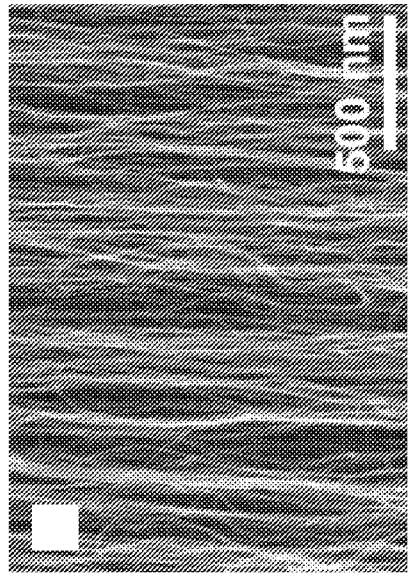
Figure 11B:
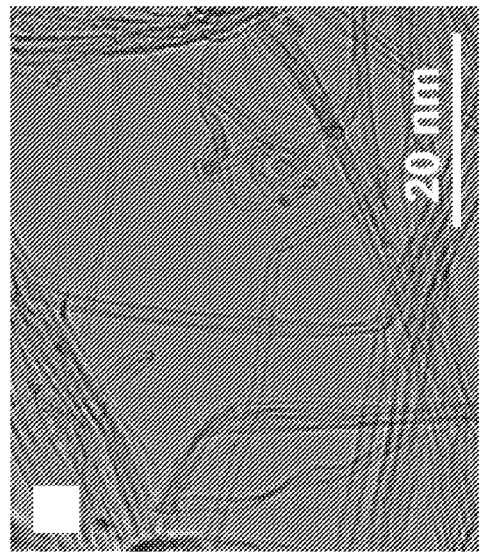
Figure 11C:
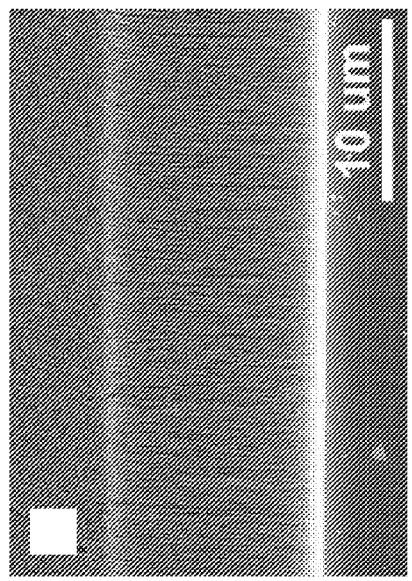
Figure 11D:
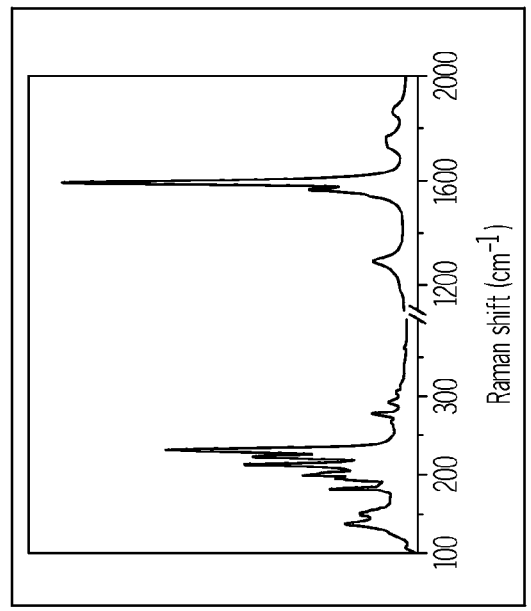

FIGS. 11A-B shows SEM images, 11C shows a Raman spectrum, and FIG. 11D shows a TEM image of VA-SWNTs on a $SiO_2$/Si substrate.

Figure 12:
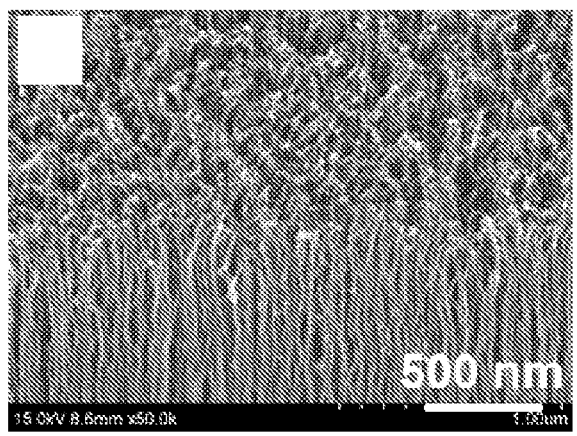

FIG. 12 shows an SEM image of VA-SWNTs.

Figure 13A:
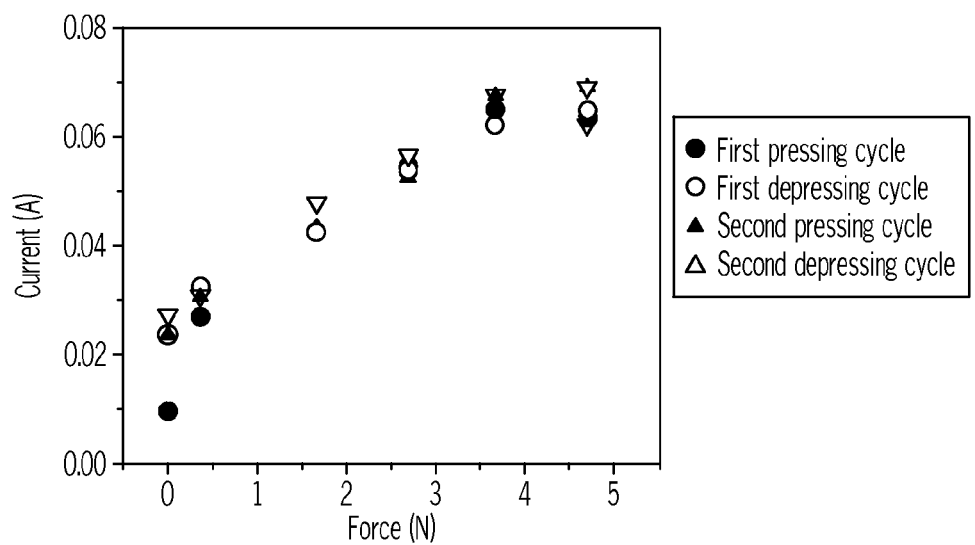
Figure 13B:
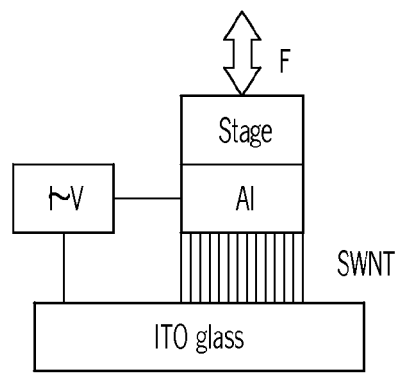
Figure 13C:
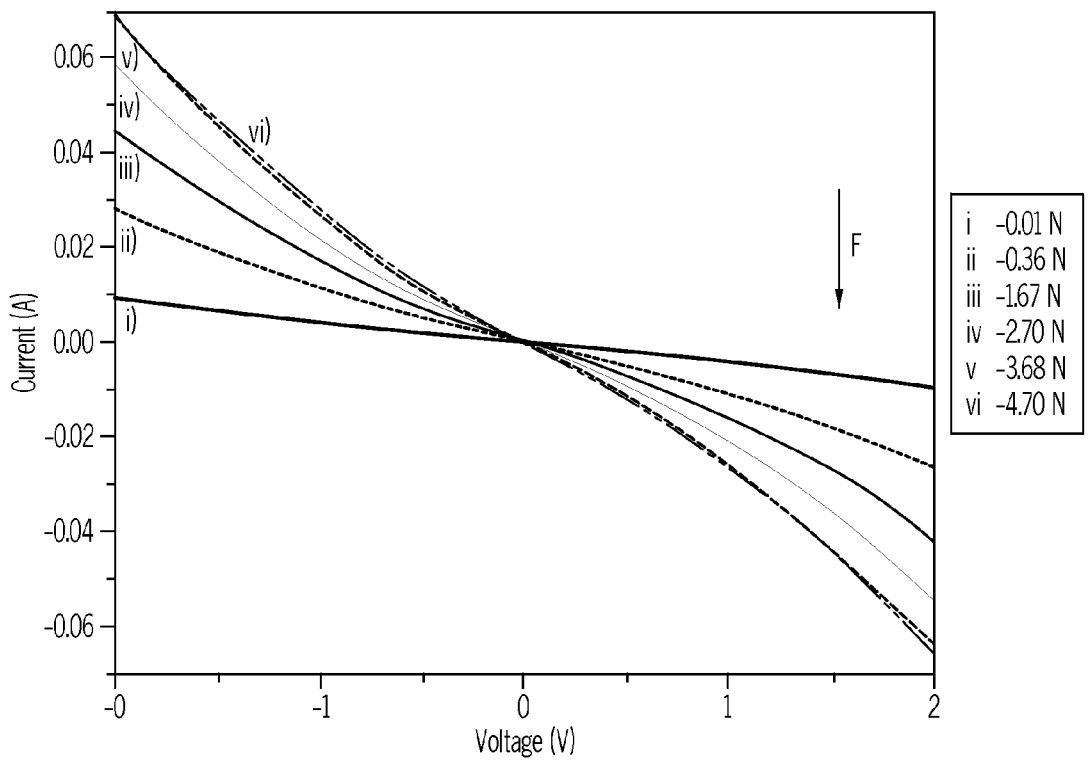
Figure 13D:
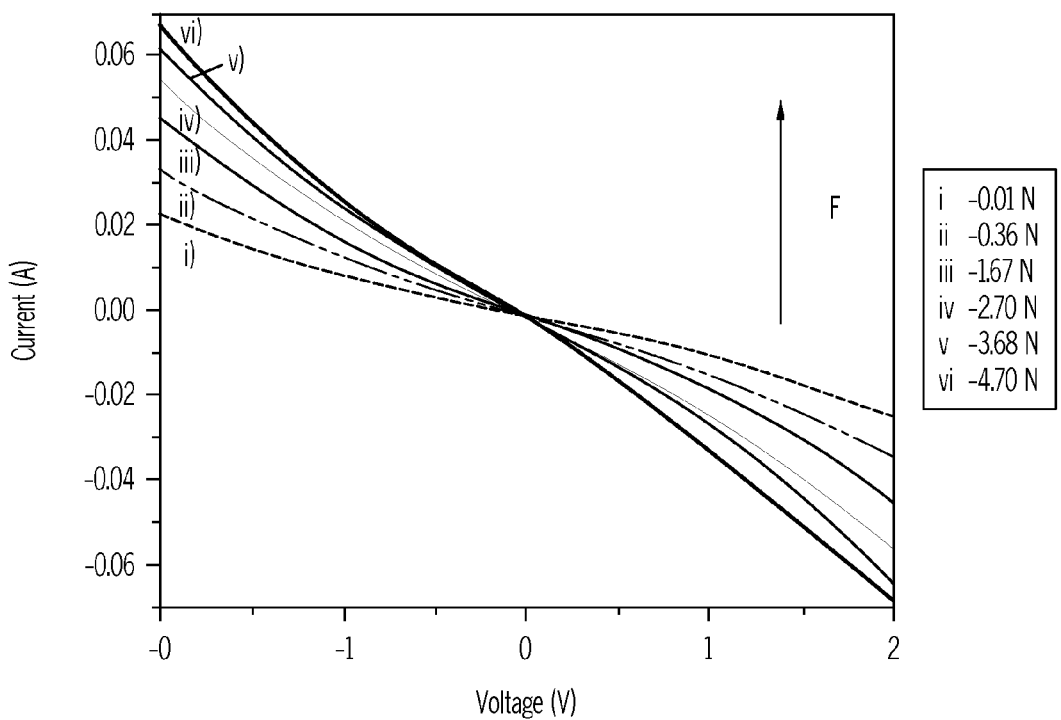

FIG. 13A is a graph showing the dependence of current on applied force, FIG. 13B a schematic showing an experimental unit for the I-V measurements, and FIGS. 13C-D are graphs showing the I-V curves for a VA-SWNT film on ITO glass.

DETAILED DESCRIPTION OF THE INVENTION

The dry adhesives of the present invention include a substrate, and an array of as-synthesized, vertically aligned single-walled or multi-walled carbon nanotubes on the substrate. The dry adhesive has a normal adhesion strength of at least about 5 N·cm$^{-2}$, and a shear adhesion strength of at least about 13 N·cm$^{-2}$.

The shear adhesion force ranged from about 10 to about 100 for VA-MWNTs having a length of about 10 to about 150 μm. The normal force increased slightly from about 10 to about 20 N·cm$^{-2}$ over the same range of lengths. The shear adhesion force for the VA-MWNTs is typically several times stronger than the corresponding normal adhesion force at a constant nanotube length.

The VA-SWNT arrays had a shear adhesion force up to about 40 N·cm$^{-2}$. The shear adhesion force increased with increasing length of the carbon nanotubes (CNTs). The normal adhesion force was in the range of about 5 to about 35 N·cm$^{-2}$. The ratio of the shear adhesion force to the normal adhesion force also increased with the length of the CNTs.

The dry adhesives use the CNT arrays as synthesized. By this, we mean that the CNT arrays are not further processed to add or remove the randomly entangled nanotube segments on the top surface of the CNT. SWNTs are formed substantially without randomly entangled nanotube segments on top, and they are used that way. MWNTs are formed with randomly entangled nanotube segments on top, and they are used that way. The CNTs can be further processed in other ways that do not affect the presence or absence of the randomly entangled nanotube segments on top of the CNTs, including, but not limited to, transferring the CNT from one substrate to another, and modifying the sidewalls or tips of the nanotubes, or combinations thereof.

The CNT arrays can be used as dry adhesives with the substrate they are grown on, or they can be grown on one substrate and transferred to another for use. For example, the CNT array can be grown on a $SiO_2$/Si substrate with an Al layer and a Fe catalyst. The array can be used on the $SiO_2$/Si substrate. Alternatively, the CNT array can be transferred to another substrate for use. The arrays can be grown on any substrate which is capable of supporting the aligned CNTs. Suitable substrates for growth include, but are not limited to, $SiO_2$, Si wafer, $SiO_2$/Si, quartz, polymers, metal films, sputter coated metal films, and the like. Suitable substrates to which the CNT could be transferred include, but are not limited to, $SiO_2$, Si wafers, $SiO_2$/Si, quartz, polymers, metal films, sputter coated metal films, plastic films, and the like. If the CNT array is transferred to another substrate, the substrate on which it was synthesized can be removed, if desired.

Examples of methods of transferring the CNT arrays to the second substrate include, but are not limited to, the methods described in S. Huang, L. Dai and A. W. H. Mau "Patterned growth and contact transfer of aligned carbon nanotube films" *J. Phys. Chem.* 103, 4223, 1999; Yang, J.; Dai, L.; Vaia, R. A. "Multicomponent interposed carbon nanotube micropatterns by region-specific contact transfer and self-assembling" *J. Phys. Chem.* B 2003, 107, 12387-12390, which are incorporated herein by reference.

MWNTs

We found that the randomly-distributed nanotube segments on top of the as-synthesized VA-MWNTs play an important role in regulating both the normal and shear adhesion forces. In particular, the presence of the randomly-distributed nanotube segments was shown to promote the shear adhesion force with respect to the normal adhesion force. Therefore, aligned carbon nanotube dry adhesives of desirable shear and normal adhesion forces can be developed by tailoring the top layer of the randomly-distributed nanotube segments. As a consequence, novel aligned carbon nanotube dry adhesives have been prepared with a shear adhesive force of up to about 100 N·cm$^{-2}$ while retaining a normal adhesion force comparable to gecko feet for easy detachment.

The VA-MWNT samples were prepared by sputter-coating a $SiO_2$/Si substrate (SQI) with about a 3-nm-thick Fe film as the catalyst layer. A thin Al (about 5 to about 10 nm) layer was pre-coated onto the substrate surface as an adhesion promoter between the resultant VA-MWNT film and the substrate. Prior to the nanotube growth, the catalyst-coated substrate was inserted into a quartz tube furnace to be preheated from room temperature up to about 450° C. and standing in air for about 10 min. The VA-MWNT arrays were grown by flowing a mixture of gases containing 48% Ar, 28% $H_2$, and 24% $C_2H_2$ at a pressure of about 10 to about 100 Torr through the quartz tube at about 750° C. for about 10 to about 20 min. The length of VA-MWNTs can be adjusted to a certain extent by controlling the reaction time and gas pressure.

Suitable catalysts are known to those of skill in the art of making MWNTs, and include, but are not limited to, Fe, Co, Ni, and their alloys with Mo, Ti, and the like, or combinations thereof.

Any hydrocarbon containing carbon elements or pure carbon can be used as a carbon source, as is known to those of skill in the art of making MWNTs. Suitable sources of carbon include, but are not limited to, $C_2H_2$, $C_2H_4$, $CH_4$, ethanol, and xylene or combinations thereof.

The shear adhesion force ranged from about 10 to about 100 for VA-MWNTs having a length of about 10 to about 150 μm, while the normal force increased slightly from about 10 to about 20 N·cm$^{-2}$.

The shear adhesion force for the VA-MWNTs is typically several times stronger than the corresponding normal adhesion force at a constant nanotube length. The shear adhesion force is generally at least about twice the normal adhesion force, or at least about three times the normal adhesion force, or at least about four times the normal adhesion force, or at least about five times the normal adhesion force.

Example 1

Aligned VA-MWNTs samples were prepared by sputter-coating a $SiO_2$/Si substrate (SQI) with a 3-nm-thick Fe film as the catalyst layer. A thin Al (5-10 nm) layer was pre-coated onto the substrate surface as an adhesion promoter between the resultant VA-MWNT film and the substrate. Prior to the nanotube growth, the catalyst-coated substrate was inserted into a quartz tube furnace to be preheated up to 450° C. in air for 10 min. The growth of the VA-MWNT arrays was then performed by flowing a mixture gases of 48% Ar, 28% $H_2$, and 24% $C_2H_2$ (10-100 Torr) through the quartz tube at 750° C. for 10-20 min.

Figure 1A:
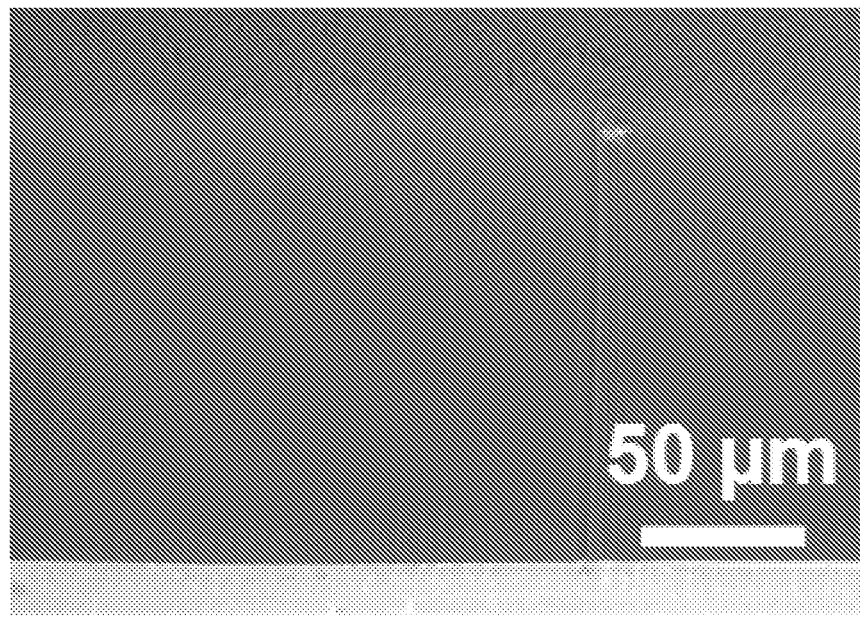
Figure 1B:
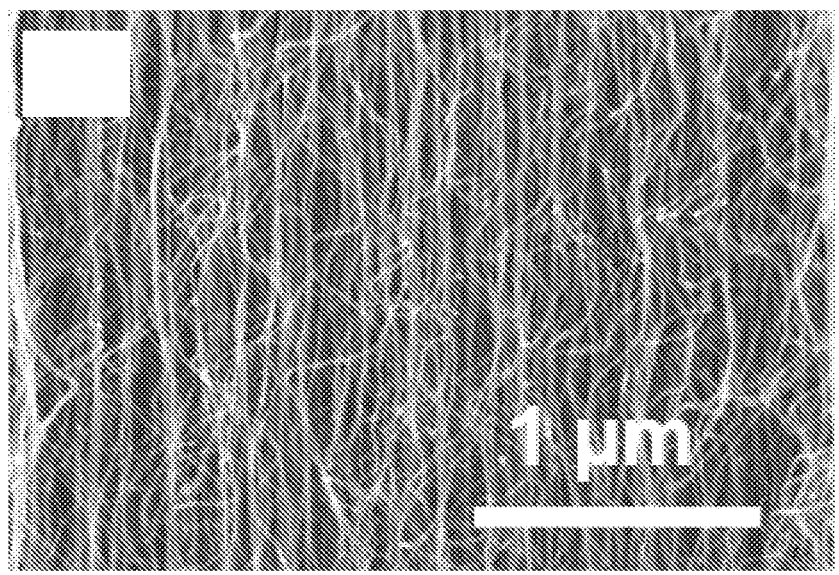

A small piece of the as-synthesized VA-MWNT film (4×4 $mm^2$) was finger pressed from the Si side onto a vertically positioned glass slide. A book of about 1500 g was hung on a thin wire that was pre-glued on the back side of the $SiO_2$/Si substrate. The nanotubes in this VA-MWNT film had diameters ranging from about 10 to about 15 nm with a tube length of about 150 μm. FIGS. 1A and 1B show the aligned VA-MWNT film under different magnifications. An overall adhesion force of about 92 $N \cdot cm^{-2}$ was estimated (measured, then calculated) for the VA-MWNT dry adhesive film.

Although it has been demonstrated that smaller contact areas have higher adhesive strengths due to the difficulties in achieving a uniform engagement of the nanotubes onto target surfaces over large surface areas, a VA-MWNT of about 3×3 $cm^2$ should be able to support a person of about 80 Kg in weight by linearly scaling up the shear adhesion force (92 $N \cdot cm^{-2}$) measured in the present study.

A preload of about 2 Kg was applied to press the aligned CNT films against the surface of a glass slide to investigate the adhesive properties of the aligned CNT films. In order to eliminate the attachment cycle effect, adhesion forces were taken from the first measurement on each of the VA-MWNT dry adhesion films.

Figure 2:
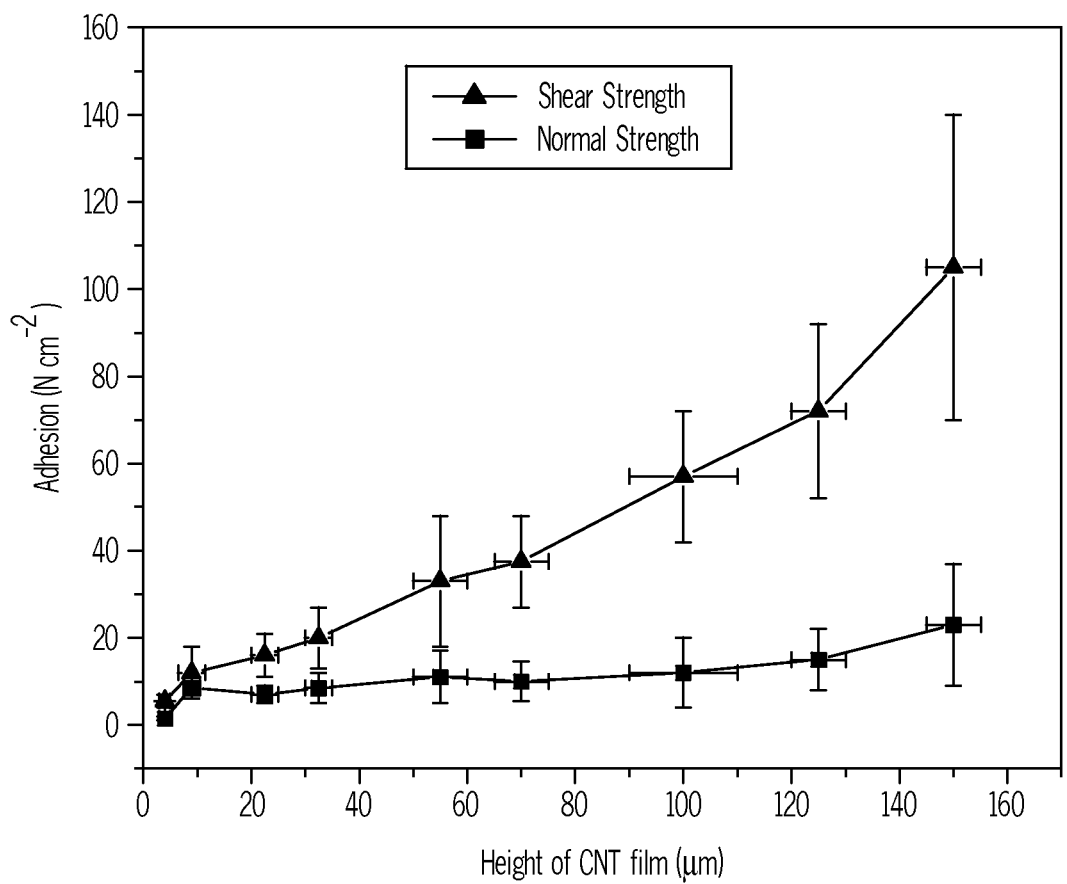
FIG. 2 is a graph showing the adhesive strength of the VA-MWNT array as a function of length.

A study of the structure-property relationship for the VA-MWNT dry adhesives was performed. As shown in FIG. 2, the normal adhesion force of the VA-MWNT films with tube lengths ranging from about 10 to about 150 μm increased slightly from about 10 to about 20 $N \cdot cm^{-2}$ with increasing nanotube length. The corresponding shear adhesion force increased from about 10 to about 100 $N \cdot cm^{-2}$ over the same range of nanotube lengths.

Example 2

The high adhesion force of the VA-MWNT dry adhesive observed in the shear direction ensures a strong adhesion to the target surface for hanging heavy objects, while the much weaker normal adhesion force allows the nanotube film to be readily detached in the normal direction. A finger-tip press (less than 2 Kg) can firmly attach a VA-MWNT film (about 100 μm long, 4×4 $mm^2$), supported by the $SiO_2$/Si substrate used for the nanotube growth (3 nm Fe/10 nm Al as a catalyst coated on $SiO_2$/Si substrate), onto a vertically-positioned glass slide to hold approximately 200 g in the shear direction. The VA-MWNT dry adhesive was peeled away from the glass slide upon turning the glass slide to a horizontal orientation with the loaded object facing towards the ground. This observation corresponds well with the easy detachment of a gecko's foot with a tilt angle from a target surface.

Figure 3:
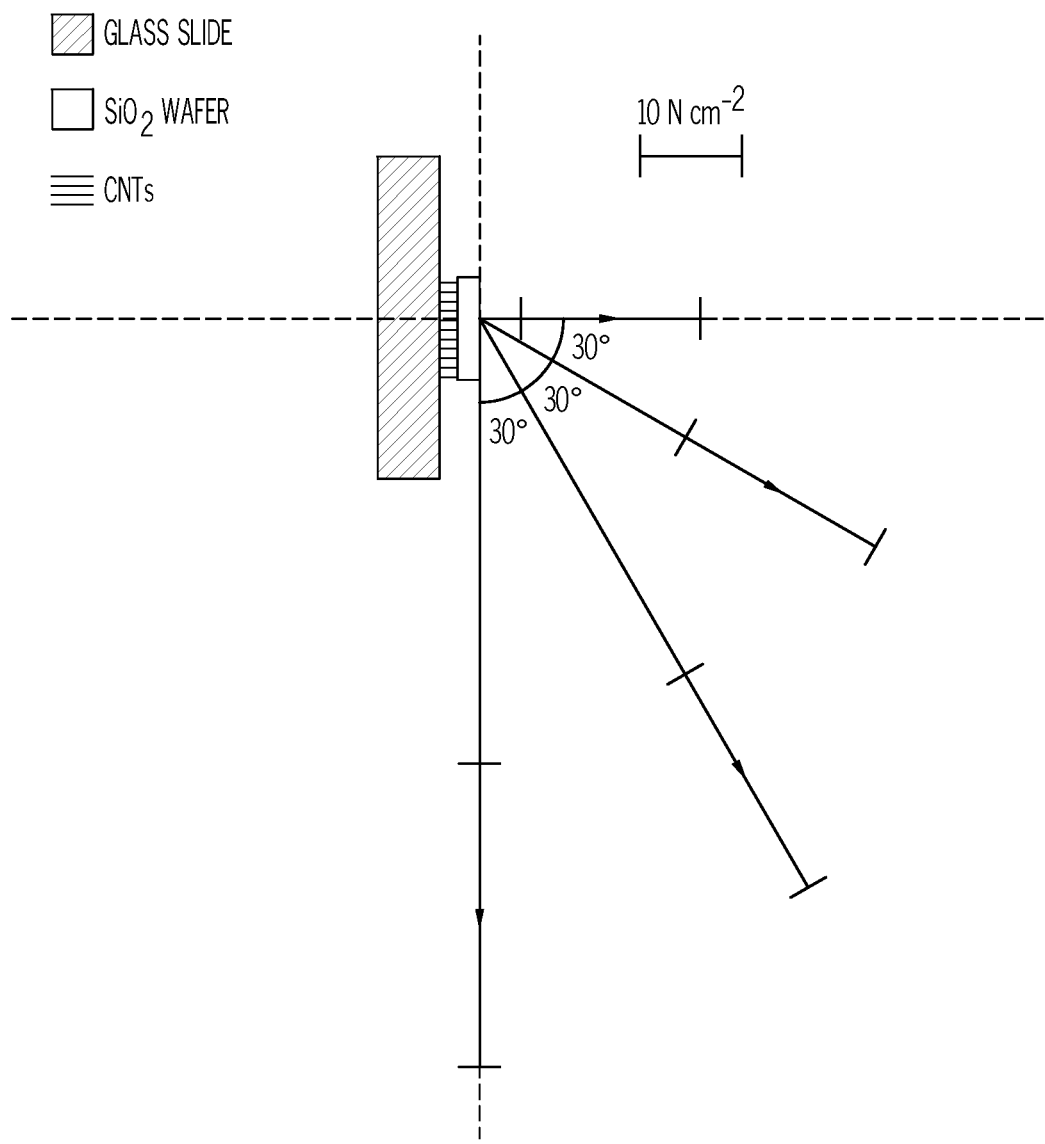
FIG. 3 is a schematic showing the adhesion strength of VA-MWNTs at different pull-away directions.

To evaluate the angle-dependence of the adhesion forces for the VA-MWNT dry adhesives, the pull-off force in various pull-away directions was measured. A laboratory balance was used to measure the pull-away force in both the normal and shear directions of aligned CNTs with a length of 100±10 μm. The decrease in the pull-off force with increasing pull-away angle shown in FIG. 3 clearly indicates that the shear adhesion force is much stronger than the normal adhesion force. This supports the observation that the VA-MWNT dry adhesive film can be readily detached from the target surface in the normal direction while being strongly adhered to the surface in the shear direction.

Example 3

Because the van der Waals force is mainly responsible for the adhesion between the nanotube adhesive film and the glass slide, the top surface of the VA-MWNT film plays a role in regulating the adhesive performance. In order to understand the difference observed between the shear and normal adhesion forces for the VA-MWNT dry adhesives, the morphology of the top surface and cross-sectional area for the VA-MWNT films with different tube lengths before and after the shear adhesion measurements was examined with SEM.

Figures 4A, 4B, 4C:
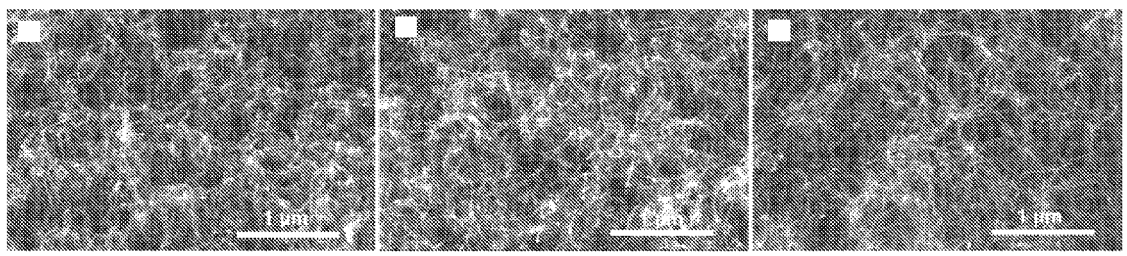
Figures 4D, 4E, 4F:
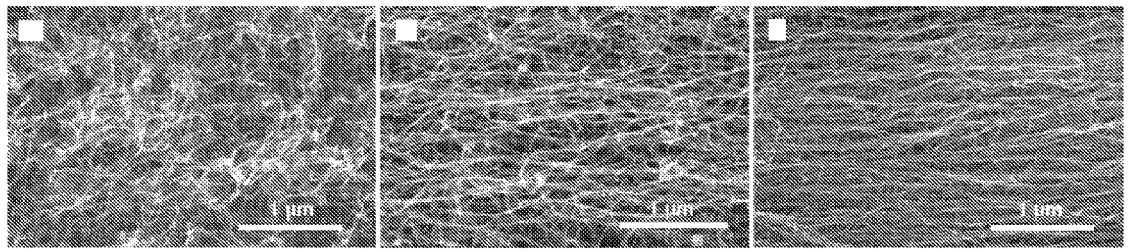
Figure 5A:
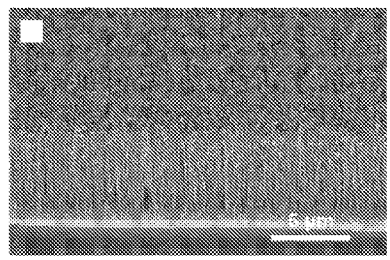
Figure 5B:
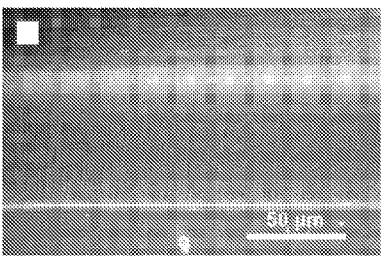
Figure 5C:
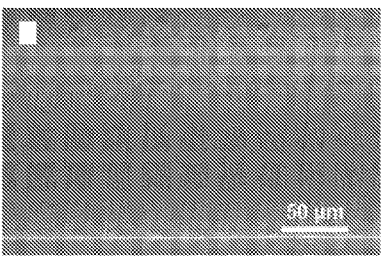
Figure 5D:
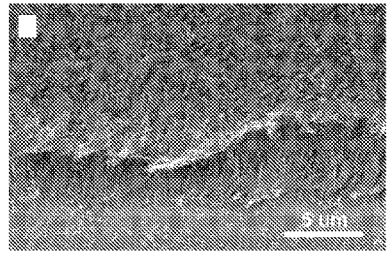
Figure 5E:
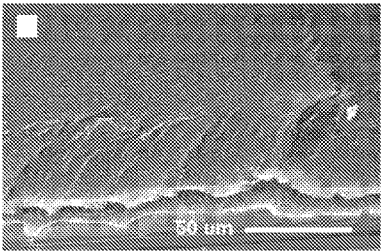
Figure 5F:
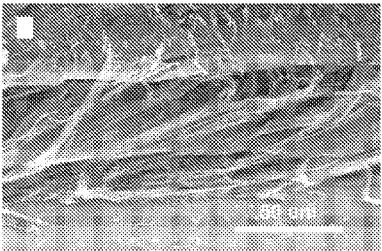

Randomly entangled nanotube segments arising from the initial stage of the "base-growth" process were observed on the top surface of the as-synthesized VA-MWNT arrays (FIGS. 4A-C). After the shear adhesion force measurements, however, the top layer of randomly entangled nanotube segments became horizontally aligned. As shown in FIGS. 4D-F and 5A-F, the degree of shear-induced horizontal alignment increased with increased tube length. The vertically-aligned nanotube "trunks" (FIGS. 5A-C) were also tilted along the shear direction (FIGS. 5D-F). The significant increase in the shear adhesion force with aligned nanotube length seen in FIG. 2, therefore, appears to be directly related to the presence of the horizontally-aligned nanotube segments on the top surface of the VA-MWNT dry adhesive film.

VA-MWNT arrays prepared by a general CVD process without a vacuum system had adhesion forces generally less than 1 $N \cdot cm^{-2}$. This may be due to contamination. Therefore, high-quality, clean samples are also very important in order to obtain a strong adhesion force.

Although not wishing to be bound by theory, the above SEM observations are consistent with the following process. During the initial contact, the relatively "rough" structure on the top nonaligned CNT segments (FIGS. 4A-C) adopted "point contacts" with the glass substrate (FIGS. 6A-B). Upon the shear adhesion force measurement (FIG. 6C), the applied shear force caused the nonaligned CNT segments (FIGS. 4A-C) to align (FIGS. 4D-F) and the vertically-aligned nanotube "trunks" (FIGS. 5A-C) to tilt (FIGS. 5D-F) along the shear direction, leading to the "line contact" with the glass surface (FIGS. 4E-F and 6C). This is also consistent with the strong length-dependence of the shear adhesion force shown in FIG. 2, because the longer aligned CNTs offer support more and/or longer to the randomly entangled nanotube segments for a more extensive "line contact" upon shear (FIGS. 4D-F and 5A-C).

During the normal adhesion force measurements, however, the aligned CNT dry adhesive was detached from the glass substrate through the "point contact" failure by pulling off the nanotube film in the normal direction. The "line contact" detachment (FIG. 6C) is expected to produce a stronger shear adhesion force than the normal adhesion force governed by the "point contact" detachment (FIG. 6D), as confirmed by FIG. 2.

Figure 7B:
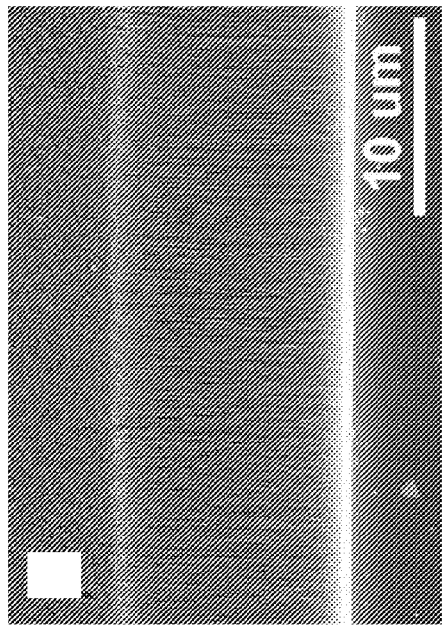
Figure 7D:
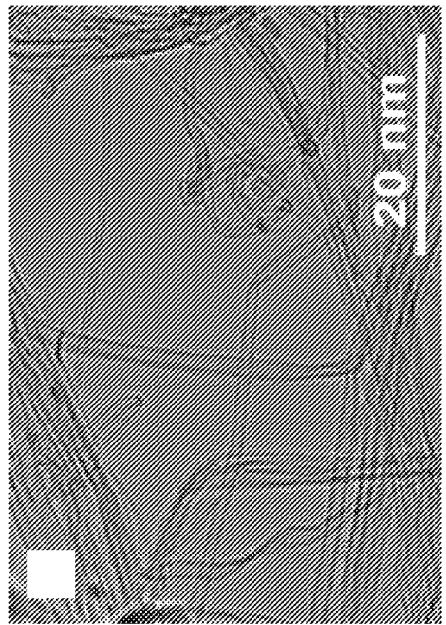
Figure 7A:
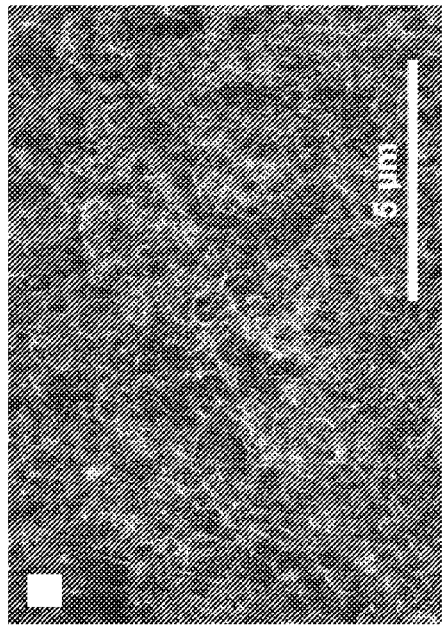
Figure 7C:
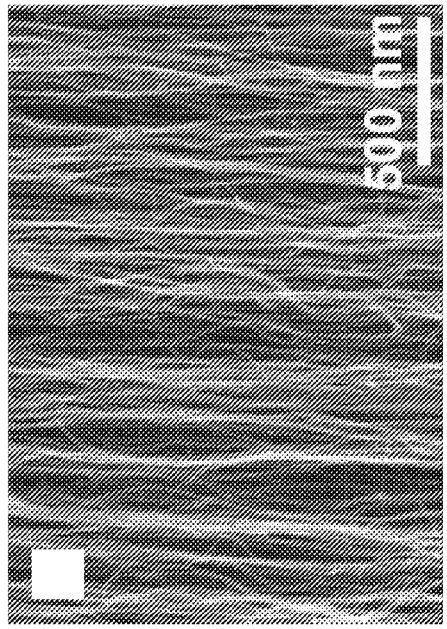

To investigate the influence of the nonaligned nanotube surface on the adhesion forces, the nonaligned CNT segments were removed from an aligned CNT film by oxygen plasma etching. FIG. 7A shows a typical SEM micrograph for the VA-MWNTs with nonaligned nanotube segments on the top surface. After oxygen plasma etching, the nonaligned nanotube segments were largely removed, and the perpendicularly-aligned nanotube "trunks" formed into the bundle-like array due to the polar interaction of the etched nanotube tips (FIG. 7C). The top-view SEM image for the pristine VA-MWNT film after the adhesion force measurements clearly shows the shear-induced alignment (FIG. 7B), as described above. FIG. 7D shows similar features for the oxygen-plasma etched aligned CNT film after the adhesion force measurements, but with much less horizontally-aligned nanotube segments on the top surface.

As expected, the removal of the nonaligned CNT segments by plasma etching largely eliminated the nanotube length-dependence for both the shear and normal adhesion forces within the experimental error (FIG. 8). Comparing FIG. 8 with FIG. 2 reveals a decrease in both the shear and normal adhesion forces. This indicates that the "point contact" is much weaker than the "line contact". However, the plasma-etching-induced "bundle" formation (FIG. 7C), together with possible surface chemistry changes, could also weaken the adhesion forces by reducing the number of effective contact points per unit area and/or interaction energy per contact with the glass surface.

Figure 9B:
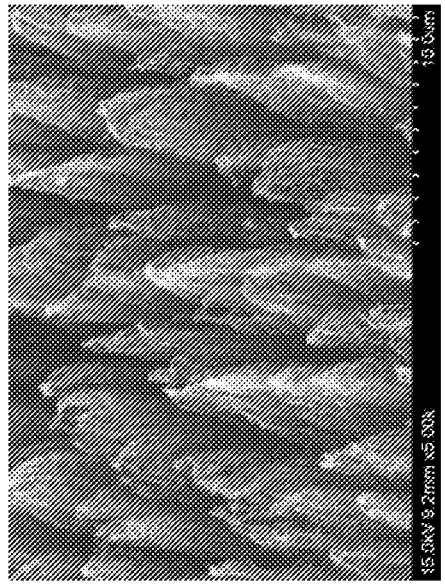
Figure 9D:
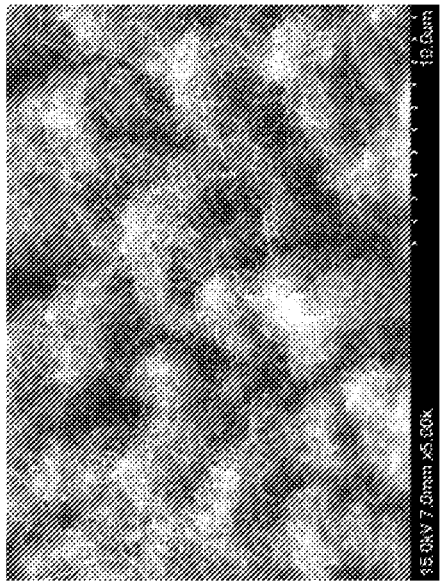
Figure 9A:
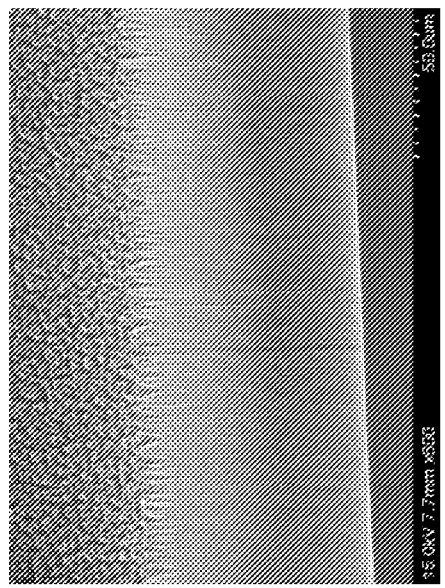
Figure 9C:
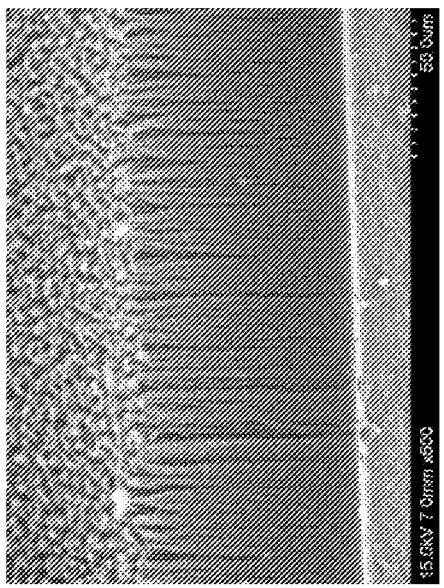

To evaluate the role of the nonaligned nanotube segments on the top surface of the VA-MWNT dry adhesive further, randomly entangled CNTs were grown on the top surface of the oxygen-plasma etched aligned CNT film. To grow CNTs on the etched CNT film, a layer of Fe (3 nm) was deposited on the surface of aligned CNT film, followed by CVD with flowing a mixture of gases containing 48% Ar, 28% $H_2$, 24% $C_2H_2$ at 750° C. at 20 Torr for 10 min. FIGS. 9A-B show that the plasma-etched sample retains the well-aligned structure and is almost free of the random CNT layer. FIGS. 9C-D show clearly the presence of the newly-grown random CNTs on top of the plasma-etched aligned CNTs.

The adhesion force measurements revealed that both the normal and shear adhesion forces increased after the growth of the nonaligned CNTs (FIG. 10). This supports the adhesion promoting effect associated with the top layer of nonaligned nanotube segments. However, the relatively poor interfacial load transfer between the post-synthesis grown nonaligned CNTs and the plasma-etched aligned CNT layers is evident by the weaker adhesion force seen in FIG. 10 with respect to that of the as-synthesized aligned CNT arrays shown in FIG. 2. The much weaker length-dependence for the shear adhesion force seen in FIG. 10 compared to FIG. 2 is attributable to the fact that the post-synthesis growth of nonaligned CNTs does not depend on the length of the VA-MWNTs. The post-synthesis grown nonaligned CNT top layer is also relatively less sensitive to the shear-induced alignment in the horizontal direction due to its highly entangled structure (compare FIG. 9C with FIGS. 4A-C).

Novel dry adhesives including aligned multi-walled carbon nanotubes have been prepared having a shear adhesive force of up to about 100 N·cm$^{-2}$ for the CNT arrays while retaining a normal adhesion force comparable to gecko feet. The salient feature for these unusually strong aligned nanotube adhesive films is the presence of a randomly-entangled CNT layer on the top of aligned nanotubes. Shear-induced horizontal alignment of the non-aligned nanotube top layer dramatically enhanced the shear adhesion force, which increased rapidly with increasing tube length. In contrast, the normal adhesion force is almost insensitive to the nanotube length. The observed high adhesion force of the VA-MWNT dry adhesive in the shear direction ensures a strong adhesion to the target surface for hanging heavy objects, and the much weaker normal adhesion force allows the nanotube film to be readily detached in the normal direction.

VA-SWNTs

A combined process of plasma-enhanced chemical vapor deposition (PECVD) and fast heating produced large scale aligned arrays of SWNTs. By fast heating, we mean moving the substrate from a cool zone into the center of a plasma-enhanced tube furnace generally in less than about 5 seconds. The heating rate is typically in the range of about 100 about 150°/sec. The VA-SWNT arrays had a macroscopic shear adhesion force up to about 40 N·cm$^{-2}$. The shear adhesion force increases with increasing length of the carbon nanotubes (CNTs). The shear adhesion for the VA-SWNT arrays can be at least about 13 N·cm$^{-2}$, at least about 15 N·cm$^{-2}$, at least about 20 N·cm$^{-2}$, at least about 30 N·cm$^{-2}$, or at least about 35 N·cm$^{-2}$.

The ratio of the shear adhesion force to the normal adhesion force also increases with the length of the CNTs. The shear adhesion strength can be at least about twice the normal adhesion strength, or at least about three times the normal adhesion strength, or at least about four times the normal adhesion strength. The difference in adhesion in the normal and shear direction provides the advantage that the dry adhesive tape of VA-SWNT film can be strongly attached and easily detached.

In a typical experiment for the synthesis of VA-SWCNTs, a thin film of Fe (1 nm) was vacuum deposited on a $SiO_2$/Si wafer pre-coated with a 10-nm-thick Al layer onto the $SiO_2$ surface. The Al coating was used to prevent the Fe catalyst from aggregation for supporting the PECVD growth of VA-SWNTs by quickly moving (generally <about 5 s) the catalyst-coated $SiO_2$/Si wafer from a cool zone (about room temperature, e.g., about 20-25° C.) into the center of a plasma-enhanced (80 W, 13.56 MHz) tube furnace heated at 750° C. where it remained for 20 min under a mixture gas of $H_2$/$CH_4$ (0.14, partial pressure ratio). This method allowed large-scale VA-SWNT arrays to be produced over a wide range of applied plasma power (30-80 W), catalyst thickness (0.2-1.0 nm Fe/10 nm Al), $H_2$/$CH_4$ partial pressure ratio (0-7), and temperature (650-750° C.).

Suitable catalysts are known to those of skill in the art of making SWNTs, and include, but are not limited to, Fe, Co, Ni, and their alloys with Mo, Ti, and the like, or combinations thereof.

Any hydrocarbon containing carbon elements or pure carbon can be used as a carbon source, as is known to those of skill in the art of making SWNTs. Suitable sources of carbon include, but are not limited to, $C_2H_2$, $C_2H_4$, $CH_4$, and ethanol, or combinations thereof.

The surface properties of the VA-SWNT film should have great influence on the adhesion capacity because of the contribution from the van der Walls interactions between the contact surface of the CNT film and the glass slide. Carbon nanotube nanocomposites can be prepared through physical casting of appropriate polymers onto the aligned carbon nanotube arrays or by chemically or electrochemically grafting polymer chains onto the nanotube structure. In either case, there should be a strong interface between the nanotube and polymer.

Surface modification covers two aspects: 1) modification of the outer wall of the aligned carbon nanotubes for enhancing compatibility with the polymer matrix and improving the adhesion properties of the VA-SWCNT to the surface; and 2) modification of the tips of the aligned carbon nanotubes for regulating adhesive performance.

With respect to sidewall modification, appropriate polymer chains can be grafted onto plasma-induced functional groups on the outer wall of the aligned carbon nanotubes to enhance their compatibility with the polymer matrix and to reversibly change the inter-tube distance by regulating the external stimulus (e.g., changing the temperature). Examples of surface modification are shown in "Shape/Size Controlled Syntheses of Metal Nanoparticles for Site Selective Modification of Carbon Nanotubes," Qu et al., J. Am. Chem. Soc., 2006, 128, 5523, which is incorporated herein by reference. Other methods include plasma modification or chemical grafting.

The tips of the aligned carbon nanotubes can be functionalized with various chemical reagents which can affect the interaction between the aligned carbon nanotubes tips and substrate. The tips can be activated by plasma treatment, with and without oxygen-containing low molecular weight gases, which functionalize the tip of the nanotubes with different group such as —COOH, —NH3, —CHO, —OH, etc., under appropriate conditions. See Chen Q D, Dai L M, Gao M, Huang S M, Mau A Journal Of Physical Chemistry B 105 (3): 618-622 Jan. 25, 2001. Water plasma etching can be used to open the nanotube tip without damaging the aligned structure. See Huang S M, Dai L M Journal Of Physical Chemistry B 106 (14): 3543-3545 Apr. 11, 2002. Examples of tip modification are shown in "Shape/Size Controlled Syntheses of Metal Nanoparticles for Site Selective Modification of Carbon Nanotubes," Qu et al., J. Am. Chem. Soc. 2006, 128, 5523.

Example 4

FIG. 11A shows a typical scanning electron microscope (SEM, Hitachi S-4800) image of VA-SWNT arrays produced by the combined PECVD and fast heating method produced as described above ($SiO_2$/Si wafer pre-coated with 1 nm Fe/10 nm Al under 80 W plasma, 0.14 $H_2$/$CH_4$ partial pressure ratio at 750° C. for 20 min.). As can be seen in FIG. 11A, the as-synthesized nanotubes aligned almost normal to the substrate surface and have a fairly uniform tubular length. The corresponding cross-sectional view under a higher magnification shows that most of the nanotubes were formed into loosely-packed "bundles" (FIG. 11B). The Raman (invia micro-Raman spectrometer, Renishaw) spectrum of the as-synthesized sample recorded with a 785 nm laser (FIG. 11C) clearly shows the resonant radial breathing modes (RBM) of SWNTs in the range of 130-280 $cm^{-1}$ corresponding to a nanotube diameter of approximately 0.8-2 nm. The clear separation of the G peaks at about 1570 and 1600 $cm^{-1}$ seen in FIG. 11C is also a characteristic for SWNTs. A transmission electron microscope (TEM, Hitachi H-7600) image of individual nanotubes dispersed from an ethanol solution reveals that the nanotubes thus prepared are exclusively SWNTs (FIG. 11D).

The as-synthesized VA-SWNT arrays had excellent dry adhesive performance. A stainless steel adapter (473 g) was held by a thin wire that was pre-glued on the back side of a $SiO_2$/Si wafer with the as-synthesized VA-SWNT array (4×4 $mm^2$) on the other side dry adhered onto a horizontally-placed glass slide. An overall adhesion force of about 29 $N\cdot cm^{-2}$ was estimated (measured, then calculated) for the VA-SWNT dry adhesive film. Although it has been demonstrated that smaller contact areas have higher adhesive strengths due to the difficulties in achieving a uniform engagement of the nanotubes onto target surfaces over large surface areas, only about 150 pieces of these small VA-SWNT arrays (4×4 $mm^2$) with a total contact area of about 5×5 $cm^2$ would be needed to hold a person of about 70 Kg.

A high resolution SEM image of the VA-SWNT film (FIG. 12) showed substantially no entangled nanotube segments on the top surface. The presence of an entangled nanotube top layer was previously demonstrated in the prior art to weaken the overall adhesion forces for VA-MWNT dry adhesives. Apart from the absence of a relatively weak entangled nanotube top layer, the small tip size of the newly-produced VA-SWNT bundles (10-20 nm), with respect to the plasma-etched VA-MWNT "bundles" (about 100 nm), microfabricated polymer hairs (0.2-4 µm), or gecko's spatulae (0.2-0.5 µm), should ensure an intimate contact with the target surface, and hence an enhanced adhesion force for the VA-SWNT dry adhesives.

The electronic properties of the VA-SWNT were evaluated. FIG. 13B shows an experimental unit for the I-V measurements (not to scale). As seen in FIG. 13A, the current (I) going through the VA-SWNT dry adhesive film increased with increasing applied force (F) at a constant voltage (V). Further increases in the applied force led to a plateau of the current. Although not wishing to be bound by theory, we believe this is due to the occurrence of the maximum compression of the nanotube structure. Consistent with the mechanical compression, the newly-observed current changes with the applied force were also found to be largely reversible upon removal of the applied force (FIG. 13A), which implies good electrical contacts between the nanotube dry adhesive and electrodes. The changes seen in FIG. 13A are reflected by the corresponding changes in I-V curves shown in FIGS. 13C and D with a similar overall semiconducting behavior for the VA-SWNTs at each of the applied forces.

The thermal behavior of the VA-SWNT dry adhesive was also studied. Three equally-weighted objects (about 100 g) were hung onto a glass-slide-adhered VA-SWNT dry adhesive film (29 $N\cdot cm^{-2}$), Scotch® brand tape (3M, about 20 $N\cdot cm^{-2}$), and thin layer of super glue (Duro® brand, Sup 2B, about 130 $N\cdot cm^{-2}$) of the same size (4 mm×4 mm), respectively. The back side of the glass slide was homogenously heated over the entire glass surface. The Scotch-tape-supported object spontaneously peeled away from the glass slide due to gravity upon heating to about 60° C. The super-glue-supported object peeled away at about 80° C. The object on the VA-SWNT film remained in place. The VA-SWNT dry adhesives possess unique thermal properties for high temperature use.

The strong adhesion forces, coupled with the excellent electronic and thermal properties, should facilitate a large variety of applications for the VA-SWNT dry adhesives, especially in various electronic devices with special needs for electrical and/or thermal management (e.g. electronic switching, high temperature use).

A method of PECVD and fast heating was developed which provided for the easy growth of large-scale VA-SWNTs over a very wide window of growth conditions. The VA-SWNT arrays were demonstrated to have a shear adhesive force of up to 29 $N\cdot cm^{-2}$. Furthermore, these vertically-aligned SWNT dry adhesives showed reversible semiconducting behaviors under load and excellent thermal resistance due to the unique thermal and electric properties intrinsically associated with SWNTs.

While certain representative embodiments and details have been shown for purposes of illustrating the invention, it will be apparent to those skilled in the art that various changes in the apparatus and methods disclosed herein may be made without departing from the scope of the invention.

What is claimed is:
1. A method of making a nanocomposite dry adhesive comprising:
   providing a substrate having a catalyst thereon;
   preheating the substrate in a tube furnace at a temperature of about 450° C. to about 750° C.;
   introducing a source of carbon into the tube furnace; and depositing an array of vertically-aligned multi-walled carbon nanotubes on the substrate using chemical vapor deposition, wherein the nanocomposite dry adhesive utilizes the array of multi-walled carbon nanotubes as synthesized, the as synthesized multi-walled carbon nanotubes having randomly entangled nanotube segments on top of the vertically aligned multi-walled carbon nanotubes, wherein the nanocomposite dry adhesive has a normal adhesion strength of at least about 5 N·cm$^{-2}$, and a shear adhesion strength of at least about 13 N·cm$^{-2}$.

2. The method of claim 1 wherein the substrate is preheated for about 10 min.

3. The method of claim 1 wherein a temperature in the tube furnace is in the range of about 650° C. to about 750° C.

4. The method of claim 1 wherein the carbon nanotubes are deposited for a time in a range of about 10 to about 20 min.

5. The method of claim 1 wherein the source of carbon is selected from $C_2H_2$, $C_2H_4$, $CH_4$, ethanol, xylene, or combinations thereof.

6. The method of claim 1 wherein the catalyst is selected from Fe, Co, Ni, alloys thereof, or combinations thereof.

7. The method of claim 1 wherein the substrate is $SiO_2$/Si, and wherein the substrate is precoated with an Al layer and an iron catalyst.

8. The method of claim 1 further comprising transferring the array of multi-walled carbon nanotubes to a second substrate.

9. The method of claim 8 wherein the second substrate is a polymer formed by a method selected from physically casting, chemical grafting, electrochemical grafting, or combinations thereof.

10. The method of claim 9 wherein physical casting is by a method selected from solution casting, or melt casting.

11. A method of making a nanocomposite dry adhesive comprising:

providing a substrate having a catalyst thereon;

moving the substrate from a cool zone of less than about 30° C. into the center of plasma-enhanced tube furnace in less than about 5 seconds;

introducing a source of carbon into the plasma-enhanced tube furnace; and depositing an array of vertically-aligned single-walled carbon nanotubes on the substrate using plasma enhanced chemical vapor deposition, wherein the nanocomposite dry adhesive utilizes the array of single-walled carbon nanotubes as synthesized, the as synthesized single-walled carbon nanotubes being substantially free of randomly entangled nanotube segments on top of the vertically aligned single-walled carbon nanotubes;

wherein the nanocomposite dry adhesive has a normal adhesion strength of at least about 5 N·cm$^{-2}$, and a shear adhesion strength of at least about 13 N·cm$^{-2}$.

12. The method of claim 11 wherein the center of the plasma-enhanced tube furnace is in the range of about 650° C. to about 750° C.

13. The method of claim 11 wherein a plasma power is in the range of about 30 to about 80 W.

14. The method of claim 11 wherein the substrate is in the center of the tube furnace for a time in a range of about 10 to about 20 min.

15. The method of claim 11 wherein the source of carbon is selected from $C_2H_2$, $C_2H_4$, $CH_4$, ethanol, or combinations thereof.

16. The method of claim 11 wherein the catalyst is selected from Fe, Co, Ni, alloys thereof, or combinations thereof.

17. The method of claim 11 wherein the substrate is $SiO_2$/Si, and wherein the substrate is precoated with an Al layer and the catalyst.

18. The method of claim 11 further comprising transferring the array of single-walled carbon nanotubes to a second substrate.

19. The method of claim 18 wherein the second substrate is a polymer layer formed by a method selected from physically casting, chemical grafting, electrochemical grafting, or combinations thereof.

20. The method of claim 19 wherein the polymer layer is formed by physical casting and wherein the physical casting is by a method selected from solution casting, or melt casting.

21. The method of claim 11 further comprising modifying a surface of the sidewall of the carbon nanotubes.

22. The method of claim 21 wherein modifying the surface of the sidewall of the carbon nanotubes comprises grafting a polymer chain onto a plasma-induced functional group on the sidewall to enhance compatibility with the polymer.

23. The method of claim 11 further comprising modifying a tip of the carbon nanotubes.

24. The method of claim 23 wherein modifying the tip of the carbon nanotubes comprises functionalizing the tip with a chemical reagent.

25. The method of claim 23 wherein modifying the tip of the carbon nanotubes comprises plasma treating the tip.

26. The method of claim 23 wherein modifying the tip of the carbon nanotubes comprises water plasma etching the tip.

* * * * *